United States Patent [19]

Hornig et al.

[11] Patent Number: 5,622,506
[45] Date of Patent: Apr. 22, 1997

[54] AVIONIC CONNECTOR INTERFACE DISTRIBUTION UNIT

[75] Inventors: James F. Hornig; Richard A. Lyon, both of Austin; James W. Sheffield, Round Rock, all of Tex.; Joseph R. Steinman, Mechanicsburg, Pa.; Steven M. Bryer, Needham; Jeffrey D. Beaton, Billerica, both of Mass.; Randolph M. Layton, Bolingbrook; Gregory J. Bassett, Lockport, both of Ill.; Donna E. Haas, Austin, Tex.

[73] Assignee: GTE Airfone Incorporated, Oak Brook, Ill.

[21] Appl. No.: 337,290

[22] Filed: Nov. 10, 1994

[51] Int. Cl.$^6$ .................................................. H05K 7/06
[52] U.S. Cl. .................................. 439/74; 439/540.1
[58] Field of Search ........................ 439/76.1, 74, 75, 439/638, 650, 651, 535, 572, 573, 540.1; 361/627, 685, 743

[56] References Cited

U.S. PATENT DOCUMENTS

| | | | |
|---|---|---|---|
| 4,824,398 | 4/1989 | Taylor | 439/557 |
| 4,944,684 | 7/1990 | Leibowitz | 439/444 |
| 5,169,335 | 12/1992 | Sayre | 439/364 |
| 5,227,955 | 7/1993 | Le Bris et al. | 439/76.1 |
| 5,353,190 | 10/1994 | Nakayama et al. | 439/34 |

*Primary Examiner*—Neil Abrams
*Attorney, Agent, or Firm*—Arnold, White & Durkee

[57] ABSTRACT

An avionic connector interface distribution unit interfaces a central controller with a plurality of avionic devices. The distribution unit comprises a large avionic connector (16), a mother input/output (I/O) printed wiring board (18), first and second daughter I/O printed wiring boards (20, 22), first and second parallel headers (28, 30) formed of matable connector pairs, and a plurality of miniature connectors (14). The mother board (18) includes first and second planar surfaces, and each of the daughter boards (20, 22) includes first and second planar surfaces. The first and second daughter boards (20, 22) are generally co-planar and adjacent to each other, and these daughter boards (20, 22) are parallel to the mother board (18). The second surface of the mother board (18) faces the first surfaces of the daughter boards (20, 22). The first header (28) is situated between and mounted to the second surface of the mother board (18) and the first surfaces of the first daughter board (20). Similarly, the second header (30) is situated between and mounted to the second surface of the mother board (18) and the first surface of the second daughter board (22). The large avionic connector (16) is mounted to the first surface of the mother board (18). The plurality of miniature connectors (14) are mounted to the second surfaces of the daughter boards (20, 22).

15 Claims, 6 Drawing Sheets

AVIONIC CONNECTOR INTERFACE DISTRIBUTION UNIT

FIELD OF THE INVENTION the present invention relates generally to avionic devices and, more particularly, relates to an avionic connector interface distribution unit for coupling a plurality of signals between a central controller and a plurality of airborne devices.

BACKGROUND OF THE INVENTION

In aircraft applications, a cabin telecommunications unit (CTU) is an aircraft telephone switching center that provides automatic switching service to airborne users of air-to-ground radio, satellite, and cabin resources. The CTU, for example, may interface to such airborne devices as North American Telephone System (NATS) airborne radio controllers, European Terrestrial Flight Telecommunications System (TFTS) radios, Satellite communication (Satcom) systems, aircraft cabin telephone zone interfaces, and cabin management systems.

Heretofore, central controllers such as CTUs have been interfaced to the airborne devices by means of point-to-point hard-wiring. Establishing such hard-wired interfaces is time-consuming and inefficient. Moreover, if a problem develops in one of the hard-wired interfaces, pinpointing the problem is generally a tedious and laborious task. Furthermore, maintenance personnel typically must repair the problem on the aircraft itself, as opposed to repairing the problem in a maintenance facility. Airlines are generally averse to maintenance personnel making the repairs while on the aircraft itself, especially when such repairs are time-consuming.

A need therefore exists for an avionic connector interface distribution unit which overcomes the aforementioned shortcomings associated with interfaces employing point-to-point hard-wiring.

SUMMARY OF THE INVENTION

In one particular embodiment, an avionic connector interface distribution unit interfaces a central controller such as a CTU with a plurality of avionic devices. The distribution unit comprises a large avionic connector, a mother input/output (I/O) printed wiring board, first and second daughter I/O printed wiring boards, first and second parallel headers, and a plurality of miniature connectors. The mother board includes first and second planar surfaces, and each of the daughter boards includes first and second planar surfaces.

The first and second daughter boards are generally co-planar and adjacent to each other, and these daughter boards are parallel to the mother board. The second surface of the mother board faces the first surfaces of the daughter boards. The first header is situated between and mounted to the second surface of the mother board and the first surface of the first daughter board. Similarly, the second header is situated between and mounted to the second surface of the mother board and the first surface of the second daughter board. The large avionic connector is mounted to the first surface of the mother board. The plurality of miniature connectors are mounted to the second surfaces of the daughter boards.

While the invention is susceptible to various modifications and alternative forms, a specific embodiment thereof has been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

Figure 1:
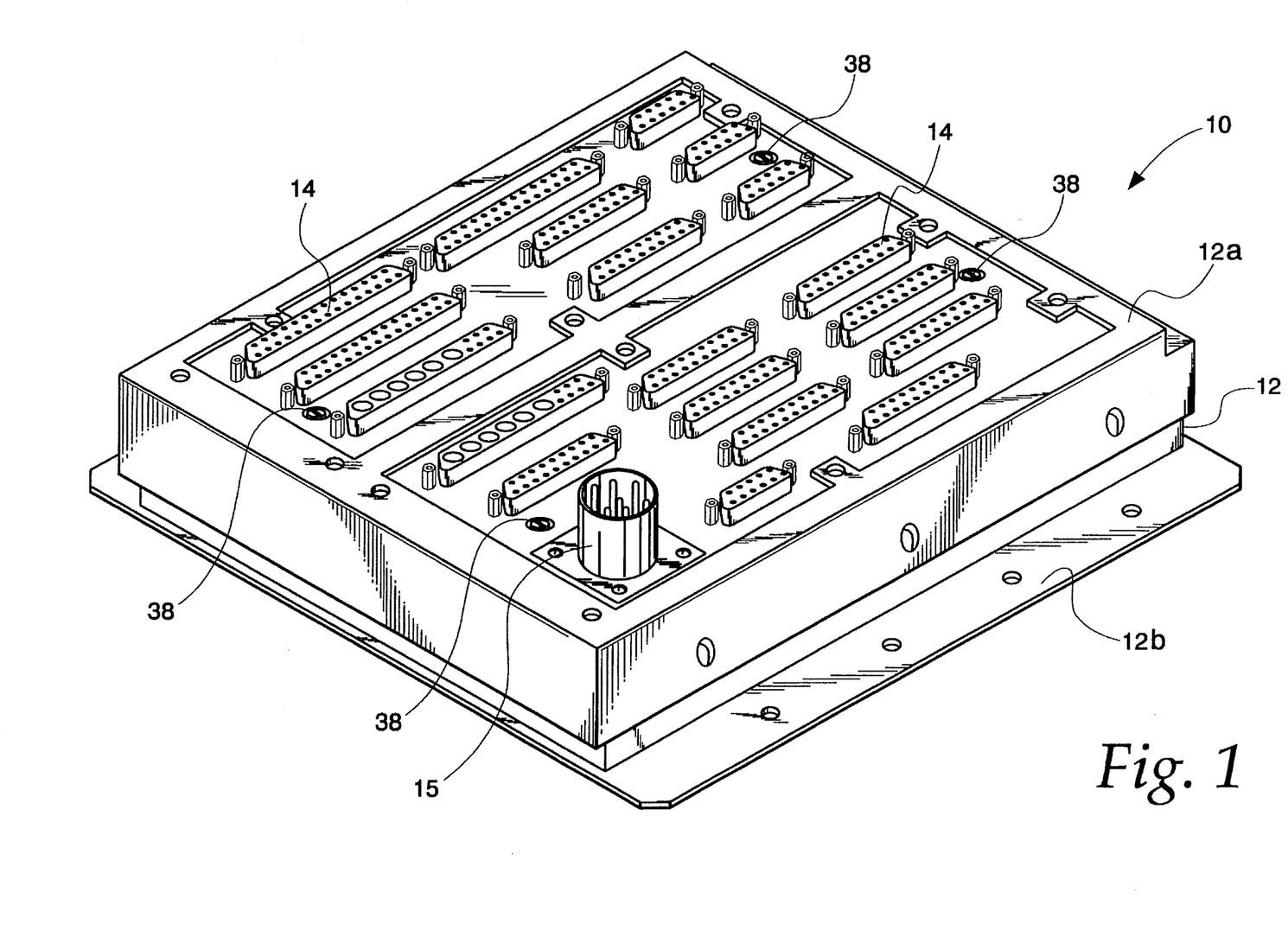
FIG. 1 is a perspective view of an avionic connector interface distribution unit embodying the present invention, showing a back side of the distribution unit.
Figure 2:
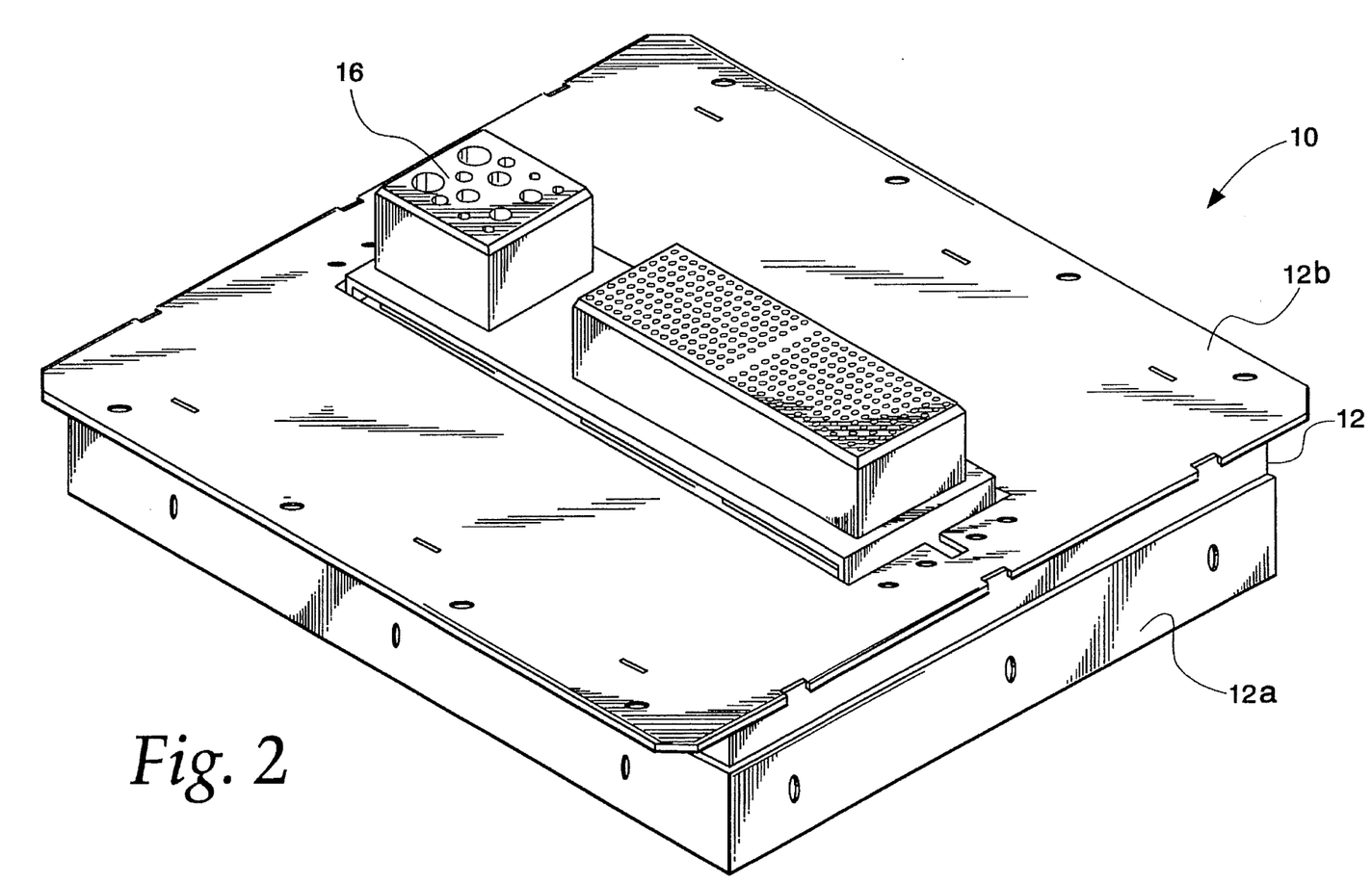
FIG. 2 is another perspective view of the avionic connector interface distribution unit in FIG. 1, showing a front side of the distribution unit.

Turning now to the drawings, FIGS. 1 and 2 illustrate the respective back and front sides of an assembled avionic connector interface distribution unit 10. The compact distribution unit 10 includes a sheet metal two-piece enclosure 12 for housing the internal components of the unit 10. The enclosure 12 is formed from a "window frame" cover 12a and a base 12b. The cover 12a forms a pair of windows exposing a plurality of miniature pin-type and/or socket-type connectors 14 (FIG. 1), such as subminiature D connectors available from Amp, Inc. of Harrisburg, Pa. These miniature connectors 14 are designed to engage with mating connectors extending from airborne devices. Similarly, the base 12 forms an opening exposing a large avionic connector 16 (FIG. 2), such as a socket-type ARINC 600 connector available from Amp, Inc. The ARINC 600 connector is compliant with the ARINC 600 standard established by Aeronautical Radio, Inc. The avionic connector 16 is designed to engage with a mating connector attached to a central controller such as a CTU.

Figure 3:
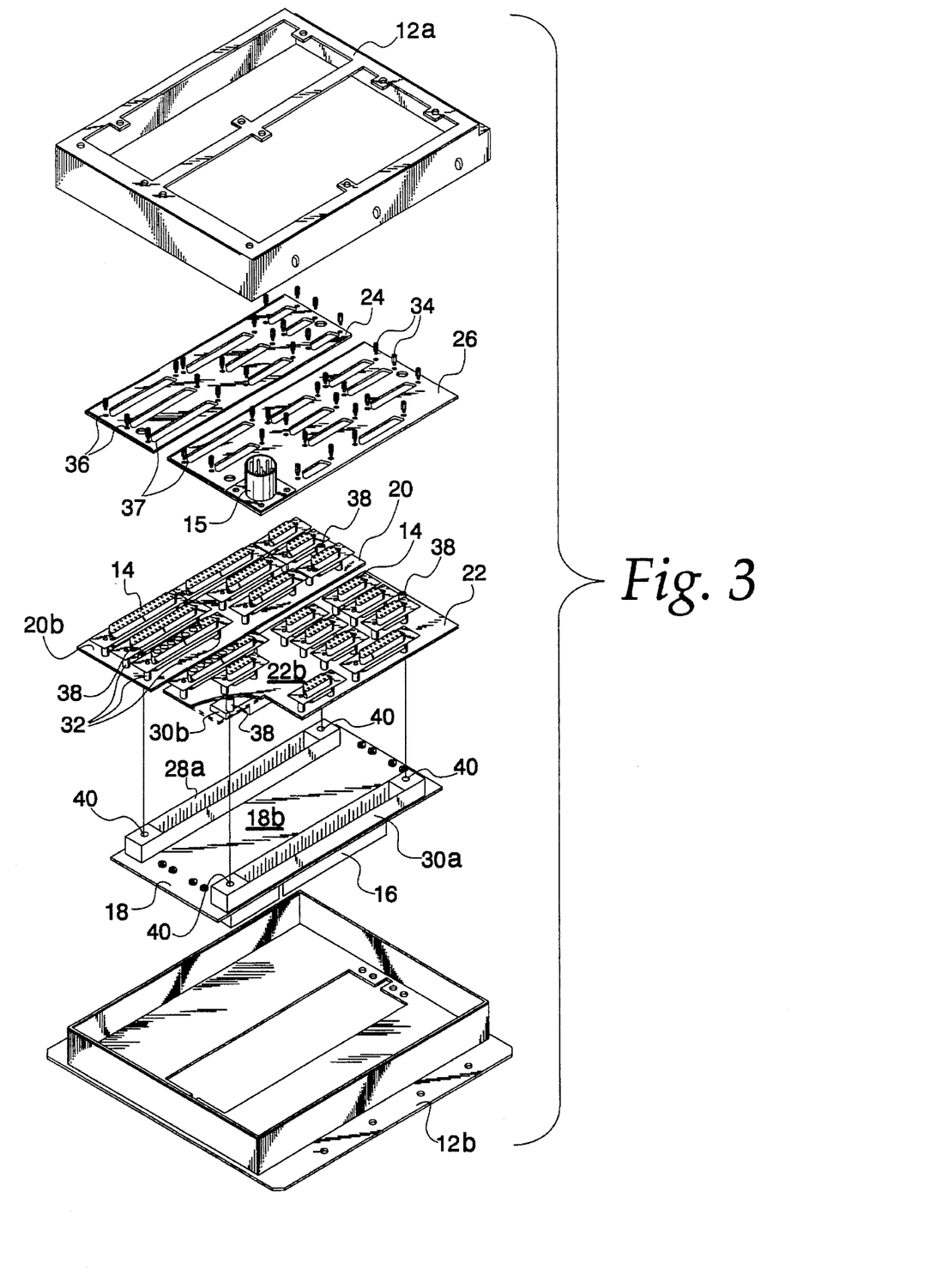
FIG. 3 is an exploded perspective view of the avionic connector interface distribution unit in FIG. 1.
Figure 4:
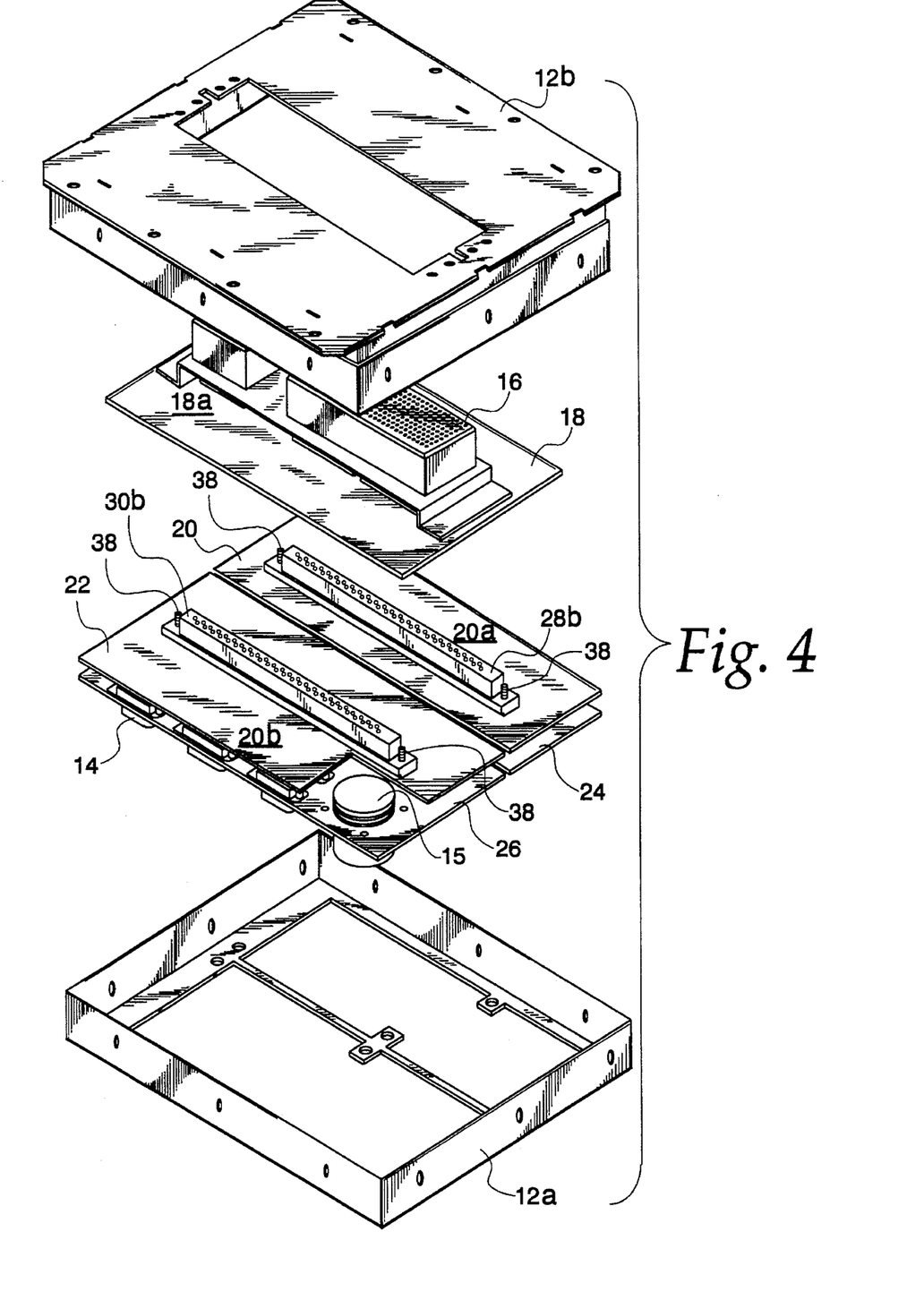
FIG. 4 is an exploded perspective view of the avionic connector interface distribution unit in FIG. 2.

Referring now to FIGS. 3 and 4, the components within the enclosure 12 include a rigid mother printed wiring board 18, a pair of rigid daughter printed wiring boards 20, 22, and a pair of sheet metal back panels 24, 26. The daughter boards 20, 22 are generally co-planar and adjacent to each other, and these daughter boards 20, 22 are parallel to the mother board 18. The large avionic connector 16 is preferably mounted to a first surface 18a of the mother board 18 by means of wave (flow) soldering (FIG. 4).

A pair of parallel header connectors 28, 30 are positioned between a second surface 18b of the mother board 18 and first surfaces of 20a, 22a of the daughter boards 20, 22. In one embodiment, the headers 28, 30 are implemented with HDI (high density) connectors available from Amp, Inc. Male (pin) portions 28a, 30a of the respective headers 28, 30 are preferably mounted to the second surface 18b of the mother board 18 by means of fountain soldering (FIG. 3). The mother board 18 is preferably composed of several thin layers containing conductive paths (traces) which electrically connect the terminals of the large connector 16 to the terminals of the male header portions 28a, 30a. These conductive paths are constructed and arranged to minimize signal line crosstalk and control impedance, minimize radiated emissions and susceptibility, and minimize voltage gradients/losses.

Female (socket) portions 28b, 30b of the respective headers 28, 30 are preferably mounted to respective first surfaces 20a, 22a of the daughter boards 20, 22 by means of fountain soldering (FIG. 4). The plurality of miniature connectors 14 are mounted to second surfaces 20b, 22b of the daughter boards 20, 22 by means of wave soldering (FIG. 3). The daughter boards 20, 22 are preferably composed of several thin layers containing conductive paths (traces) which electrically connect the terminals of the miniature connectors 14 to the terminals of the female header portions 28b, 30b. These conductive paths are constructed and arranged to minimize signal line crosstalk and control impedance, minimize radiated emissions and susceptibility, and minimize voltage gradients/losses.

Prior to mounting the miniature connectors 14 to the daughter boards 20, 22, it is desirable to install standoffs 32 into the daughter boards 20, 22 and then attach the connectors 14 to the standoffs 32 (FIG. 3). A pair of standoffs 32 are employed with each miniature connector 14. The standoffs 32 are used to support the shoulders of the miniature connectors 14 at an equal distance from the daughter boards 20, 22, thereby aligning the miniature connectors 14 relative to each other and providing the distribution unit 10 with mechanical integrity.

The back panels 24, 26 are attached to the miniature connectors 14 using screwlocks 34 (FIG. 3). The male threaded portions of the screwlocks 34 are inserted into corresponding apertures 36 in the back panels 24, 26 and then threaded into threaded axial bores extending through the standoffs 32. The small circular apertures 36 in the back panels 24, 26 are spaced in accordance with the standoffs 32 such that the apertures 36 are the same in number, arrangement, and spacing as the standoffs 32. The back panels 24, 26 are provided with relatively large apertures 37 to accommodate the miniature connectors 14. As illustrated in FIG. 1, the miniature connectors 14 protrude through these large apertures 37 when the distribution unit 10 is in assembled form.

In addition to the miniature connectors 14, the distribution unit 10 includes a cylindrical power connector 15 available from Amp, Inc. The power connector 15 passes through a large circular aperture in the back panel 24, and a shoulder of the power connector 15 is fastened to the back panel 26 using conventional means such as screws or bolts. A corner section of the daughter board 22 is cut away to accommodate electrical leads (not shown) extending from the power connector 15. These electrical leads are connected to both the mother board 18 and the daughter boards 20, 22.

In preparation for mating the female header portions 28b, 30b with the respective male header portions 28a, 30a, two jackscrews 38 are installed at opposing ends of each of the female header portions 28b, 30b. Each jackscrew 38 passes through aligned apertures in its associated female header portion, daughter board, and back panel. The male fitting of each jackscrew 38 protrudes from its associated female header portion in the direction of the mating male header portion.

Figure 5:
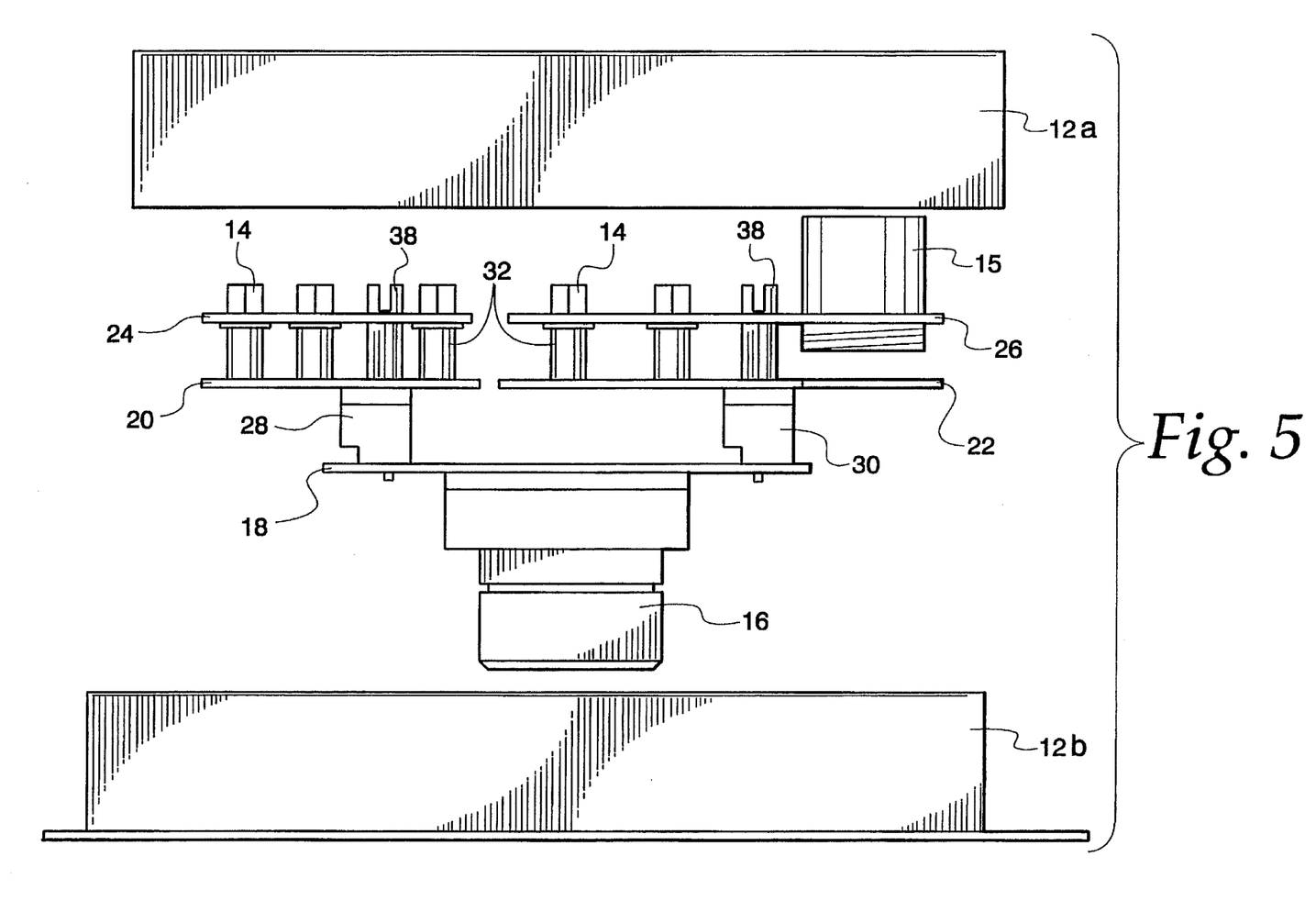
FIG. 5 is a side view of the avionic connector interface distribution unit in FIG. 1 prior to attaching the two-piece enclosure.

To connect the female header portions 28b, 30b to the respective male header portions 28a, 30a, the female header portions 28b, 30b are first mated with the respective male header portions 28a, 30a. Next, to fixedly attach the mated male and female portions of the headers 28, 30, the male fittings of the jackscrews 38 are threaded into corresponding threaded holes 40 formed in the male header portions 28a, 30a by rotating the heads of the jackscrews 38 (FIG. 3). Since the jackscrews 38 pass through their associated back panels, the heads of the jackscrews 38 are externally accessible from the front side of the distribution unit 10 for purposes of rotating the heads of the jackscrews 38. Rotating and tightening the jackscrews 38 brings the female and male portions of the headers 28, 30 together, as shown in FIG. 5. In addition to permitting access to the jackscrews 38 from the front side of the unit 10, the passage of the jackscrews 38 through the daughter boards 20, 22 and the back panels 24, 26 provides keying for proper installation of these elements (see FIG. 1).

Once the female header portions 28b, 30b are firmly engaged to the respective male header portions 28a, 30a, the distribution unit 10 appears as depicted in FIG. 5. The final assembly steps involve securing the assembled internal components of the distribution unit 10 within the two-piece enclosure 12. To fasten the enclosure 12, the "window frame" cover 12a is first attached to the back panels 24, 26 using conventional means such as screws or bolts. The cover 12a of the enclosure 12 is then attached to the base 12b using screws or bolts. The completely assembled distribution unit 10 is illustrated in FIGS. 1 and 2.

One advantageous feature of the connector interface distribution unit 10 is that it is considerably more compact than previous structures (i.e., hard-wiring) for connecting central controllers to airborne devices.

Another particularly advantageous feature of the connector interface distribution unit 10 is that the unit 10 is able to accommodate normal dimensional tolerances. Employing two separate daughter boards 20, 22, as opposed to a single large daughter board, enhances the dimensional tolerance control of the unit 10 for several reasons. First, the use of two daughter boards 20, 22 permits each of the headers 28, 30 to move independently, thereby allowing each of the headers 28, 30 to be bottomed-out using the jackscrews 38. The jackscrews 38, in turn, facilitate assembly and disassembly of the unit 10 and ensure that the female and male portions of the headers 28, 30 are fully mated for vibration endurance. Second, the use of two daughter boards 20, 22 reduces the mating forces between the female and male portions of the headers 28, 30. Stress on one of the headers 28, 30 does not directly cause stress to the other of the headers 28, 30 because the headers 28, 30 are free to move independently.

Third, since the two daughter boards 20, 22 are not rigidly connected to each other, the daughter boards 20, 22 are free to shift and "float" somewhat relative to each other. As a result, the headers 28, 30 need not be closely registered with respect to each other using special tooling fixtures and extra process controls. For example, if the distance between the female header portions 28b, 30b is not exactly equal to the distance between the male header portions 28a, 30a prior to mating the female header portions 28b, 30b with the respective male header portions 28a, 30a, the daughter boards 20, 22 will shift relative to each other so that the female header portions 28b, 30b properly register and mate with the respective male header portions 28a, 30a. If, on the other hand, the daughter 10 boards 20, 22 were integrally joined to form a single daughter board, the distance between the female header portions would need to be virtually identical to the distance between the male header portions to permit proper alignment of sockets and pins during mating. To generate such exactitude in the positioning of the headers 28, 30, the allowable manufacturing tolerances would be severely limited, which in turn would increase the cost of manufacturing.

A further advantageous feature of the connector interface distribution unit 10 is that the unit 10 is designed to perform adequately under vibration. As stated previously, the jackscrews 38 ensure that the female and male portions of the headers 28, 30 are fully mated so as to promote positive performance of the unit 10 under vibration. Furthermore, since the standoffs 32 support the miniature connectors 14 at an equal distance from the surfaces 20*b*, 22*b* of the daughter boards 20, 22 and since the back panels 24, 26 are fastened to the standoffs 32, the standoffs 32 effectively fortify the daughter boards 20, 22.

Figure 6:
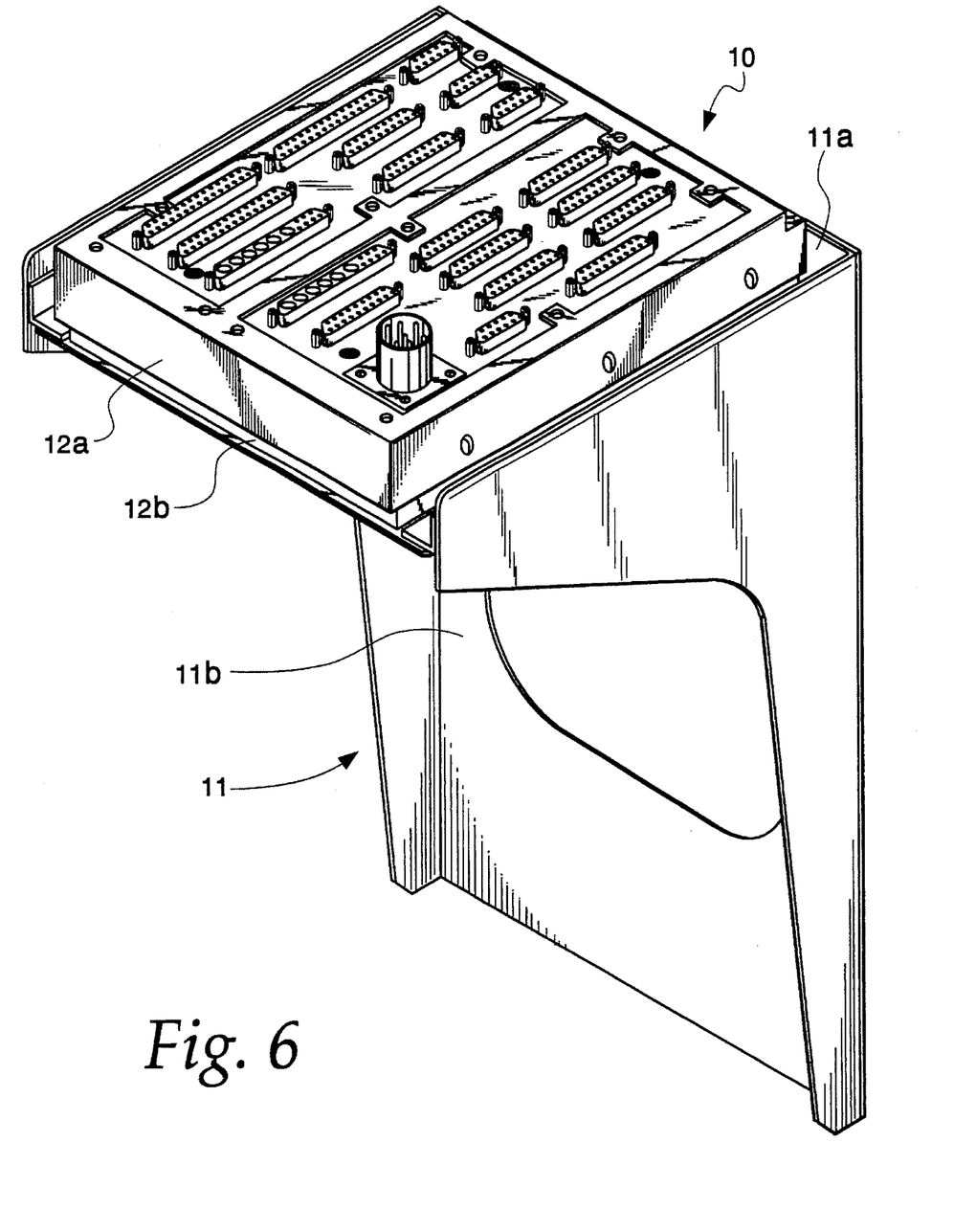
FIG. 6 is a perspective view of the avionic connector interface distribution unit in FIG. 1, showing the unit mounted to an air tray.

Yet another advantageous feature of the connector interface distribution unit 10 is that it facilitates servicing thereof. As shown in FIG. 6, the distribution unit 10 is mounted to an air tray 11 of an aircraft. The enclosure 12 of the unit 10 is attached to the air tray 11 with the cover 12*a* facing a back side 11*a* of the air tray 11 and the base 12*b* facing a front side 11*b* of the air tray 11. The air tray 11 is typically mounted in the aircraft such that the front side 11*b* of the air tray 11 is more accessible to service personnel than the back side 11*a*. If the servicing merely entails connection or disconnection of one or more connectors which mate with the miniature connectors 14, the service personnel can easily access the unit 10 via the front side 11*b* of the air tray 11, detach the unit 10 from the air tray 11, and quickly connect or disconnect the appropriate connectors. If the servicing entails repairing a problem which has developed in the unit 10, the service personnel can easily detach the unit 10 from the air tray 11 and replace the unit 10 with one which works properly. The unit requiring repair can then be brought to a maintenance facility away from the aircraft.

While the present invention has been described with reference to one or more particular embodiments, those skilled in the art will recognize that many changes may be made thereto without departing from the spirit and scope of the present invention.

For example, the distribution unit 10 may employ more or less than two headers, two daughter boards, and two back panels, depending upon the number of required interconnections between the large avionic connector 16 and the miniature connectors 14. Thus, if less avionic devices are to be interfaced to the central controller, the number of miniature connectors 14 would be reduced and, accordingly, only one header, one daughter board, and one back panel might be required to accommodate the reduced number of interconnections. If more avionic devices are to be interfaced to the central controller, the number of miniature connectors 14 would be increased and, accordingly, more than two headers, daughter boards, and back panels might be required. It is preferable to mount the headers on separate daughter boards so that the distribution unit is able to accommodate normal dimensional tolerances.

Each of these embodiments and obvious variations thereof is contemplated as falling within the spirit and scope of the claimed invention, which is set forth in the following claims.

What is claimed is:

1. An avionic connector interface distribution unit for interfacing a central controller with a plurality of avionic devices, comprising:

a mother printed wiring board including first and second planar surfaces;

first and second daughter printed wiring boards, each of said daughter boards including first and second planar surfaces, said first and second daughter boards being generally co-planar and adjacent to each other and being generally parallel to said mother board, said first surfaces of said daughter boards facing said second surface of said mother board;

first and second parallel headers, said first header being mounted between said second surface of said mother board and said first surface of said first daughter board, said second header being mounted between said second surface of said mother board and said first surface of said second daughter board;

a large avionic connector mounted to said first surface of said mother board; and a plurality of miniature connectors mounted to said second surfaces of said daughter boards.

2. The distribution unit of claim 1, further including a plurality of standoffs mounted to said daughter boards and arranged to support said miniature connectors at an equal distance from said daughter boards.

3. The distribution unit of claim 1, further including a plurality of jackscrews installed in said headers, said jackscrews fully mating male and female portions of each of said headers.

4. The distribution unit of claim 3, wherein said male portion of each of said headers is mounted to said mother board and said female portions of said first and second headers are mounted to said respective first and second daughter boards.

5. The distribution unit of claim 1, further including an enclosure housing said mother board, said daughter boards, and said headers.

6. The distribution unit of claim 5, wherein said enclosure includes a base portion adjacent to said first surface of said mother board, said avionic connector protruding through an aperture in said base portion.

7. The distribution unit of claim 1, further including first and second back panels mounted adjacent and generally parallel to said second surfaces of said respective first and second daughter boards.

8. The distribution unit of claim 7, further including a plurality of standoffs mounted between said daughter boards and said back panels and arranged to support said miniature connectors at an equal distance from said daughter boards.

9. The distribution unit of claim 7, further including a plurality of jackscrews installed in said headers and extending through said daughter boards and said back panels, said jackscrews fully mating male and female portions of each of said headers.

10. The distribution unit of claim 7, further including an enclosure housing said mother board, said daughter boards, said headers, and said back panels.

11. The distribution unit of claim 10, wherein said enclosure includes a window frame cover adjacent to said back panels and exposing said miniature connectors.

12. An avionic connector interface distribution unit for interfacing a central controller with a plurality of avionic devices, comprising:

a mother printed wiring board including first and second planar surfaces;

a daughter printed wiring board including first and second planar surfaces, said daughter board being generally parallel to said mother board, said first surface of said daughter board facing said second surface of said mother board;

a header mounted between said second surface of said mother board and said first surface of said daughter board;

a large avionic connector mounted to said first surface of said mother board;

a plurality of miniature connectors mounted to second surface of said daughter board;

a back panel mounted adjacent and generally parallel to said second surface of said daughter board; and a plurality of standoffs mounted between said daughter board and said back panel and arranged to support said miniature connectors at an equal distance from said daughter board.

13. An avionic connector interface distribution unit for interfacing a central controller with a plurality of avionic devices, comprising:

a mother printed wiring board including first and second planar surfaces;

a daughter printed wiring board including first and second planar surfaces, said daughter board being generally parallel to said mother board, said first surface of said daughter board facing said second surface of said mother board;

a header mounted between said second surface of said mother board and said first surface of said daughter board;

a large avionic connector mounted to said first surface of said mother board;

a plurality of miniature connectors mounted to said second surface of said daughter board;

a back panel mounted adjacent and generally parallel to said second surface of said daughter board; and a pair of jackscrews installed in said header and extending through said daughter board and said back panel, said jackscrews fully mating male and female portions of said header.

14. An avionic connector interface distribution unit for interfacing a central controller with a plurality of avionic devices, comprising:

a mother printed wiring board including first and second planar surfaces;

a daughter printed wiring board including first and second planar surfaces, said daughter board being generally parallel to said mother board, said first surface of said daughter board facing said second surface of said mother board;

a header mounted between said second surface of said mother board and said first surface of said daughter board;

a large avionic connector mounted to said first surface of said mother board;

a plurality of miniature connectors mounted to said second surface of said daughter board;

a back panel mounted adjacent and generally parallel to said second surface of said daughter board; and an enclosure housing said mother board, said daughter board, said header, and said back panel, said enclosure including a window frame cover adjacent to said back panel and exposing said miniature connectors.

15. An avionic connector interface distribution unit for interfacing a central controller with a plurality of avionic devices, comprising:

a mother printed wiring board including first and second planar surfaces;

first and second daughter printed wiring boards, each of said daughter boards including first and second planar surfaces, said first and second daughter boards being generally co-planar and adjacent to each other and being generally parallel to said mother board, said first surfaces of said daughter boards facing said second surface of said mother board;

first and second parallel headers, said first header being mounted between said second surface of said mother board and said first surface of said first daughter board, said second header being mounted between said second surface of said mother board and said first surface of said second daughter board;

first and second back panels mounted adjacent and generally parallel to said second surfaces of said respective first and second daughter boards;

a large avionic connector mounted to said first surface of said mother board;

a plurality of miniature connectors mounted to said second surfaces of said daughter boards; and an enclosure housing said mother board, said daughter boards, said headers, and said back panels, said enclosure exposing said large avionic connector and said miniature connectors.

* * * * *